United States Patent
Hashimoto et al.

(10) Patent No.: US 12,394,632 B2
(45) Date of Patent: Aug. 19, 2025

(54) PLASMA PROCESSING METHOD AND PLASMA PROCESSING SYSTEM

(71) Applicant: Tokyo Electron Limited, Tokyo (JP)

(72) Inventors: Atsuki Hashimoto, Miyagi (JP); Sho Saitoh, Miyagi (JP); Yoshimitsu Kon, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 316 days.

(21) Appl. No.: 18/112,302

(22) Filed: Feb. 21, 2023

(65) Prior Publication Data

US 2023/0268190 A1   Aug. 24, 2023

(30) Foreign Application Priority Data

Feb. 21, 2022   (JP) ................. 2022-025104

(51) Int. Cl.
*H01L 21/311* (2006.01)
*H01J 37/32* (2006.01)

(52) U.S. Cl.
CPC .. *H01L 21/31116* (2013.01); *H01J 37/32174* (2013.01); *H01J 37/32449* (2013.01); *H01L 21/31144* (2013.01); *H01J 2237/3346* (2013.01)

(58) Field of Classification Search
None
See application file for complete search history.

(56) References Cited

U.S. PATENT DOCUMENTS

2015/0235861 A1   8/2015   Mizuno et al.
2016/0336191 A1*  11/2016   Saitoh .................... H10B 43/50

FOREIGN PATENT DOCUMENTS

WO   2014/046083 A1   3/2014

* cited by examiner

*Primary Examiner* — Roberts P Culbert
(74) *Attorney, Agent, or Firm* — PROCOPIO, CORY, HARGREAVES & SAVITCH LLP

(57) ABSTRACT

A plasma processing method executed by a plasma processing apparatus with a chamber is provided. The method includes (a) providing in the chamber a substrate that includes an etching film and a mask film, the substrate including a first region where the etching film is exposed and a second region where the mask film is exposed, (b) supplying into the chamber a processing gas including a carbon-containing gas to generate plasma from the processing gas to etch the etching film and to form a protective film on the mask film, and (c) supplying the processing gas into the chamber to generate plasma from the processing gas to further etch the etching film and to remove at least part of the protective film. (b) includes a first period and a second period, and a flow rate of the carbon-containing gas in the first period is greater than a flow rate of the carbon-containing gas in the second period, and (c) includes a third period and a fourth period, and a flow rate of the carbon-containing gas in the third period is less than the flow rate of the carbon-containing gas in the second period and a flow rate of the carbon-containing gas in the fourth period.

19 Claims, 10 Drawing Sheets

PLASMA PROCESSING METHOD AND PLASMA PROCESSING SYSTEM

CROSS-REFERENCE TO RELATED APPLICATIONS

This application claims priority to Japanese Patent Application No. 2022-025104, filed on Feb. 21, 2022, the entire contents of which are incorporated herein by reference.

BACKGROUND

Exemplary embodiments of the present disclosure relate to a plasma processing method and a plasma processing system.

WO 2014/046083 discloses a technique for improving a selectivity to a mask film.

SUMMARY

One exemplary embodiment of the present disclosure provides a plasma processing method executed by a plasma processing apparatus with a chamber. The plasma processing method includes (a) providing into the chamber a substrate that includes an etching film and a mask film, the substrate including a first region where the etching film is exposed and a second region where the mask film is exposed, (b) supplying into the chamber a processing gas including a carbon-containing gas to generate plasma from the processing gas to etch the etching film and to form a protective film on the mask film, and (c) supplying the processing gas into the chamber to generate plasma from the processing gas to further etch the etching film and to remove at least part of the protective film, wherein (b) includes a first period and a second period, and a flow rate of the carbon-containing gas in the first period is greater than a flow rate of the carbon-containing gas in the second period, and (c) includes a third period and a fourth period, and a flow rate of the carbon-containing gas in the third period is less than the flow rate of the carbon-containing gas in the second period and a flow rate of the carbon-containing gas in the fourth period.

DETAILED DESCRIPTION

Figure 1:
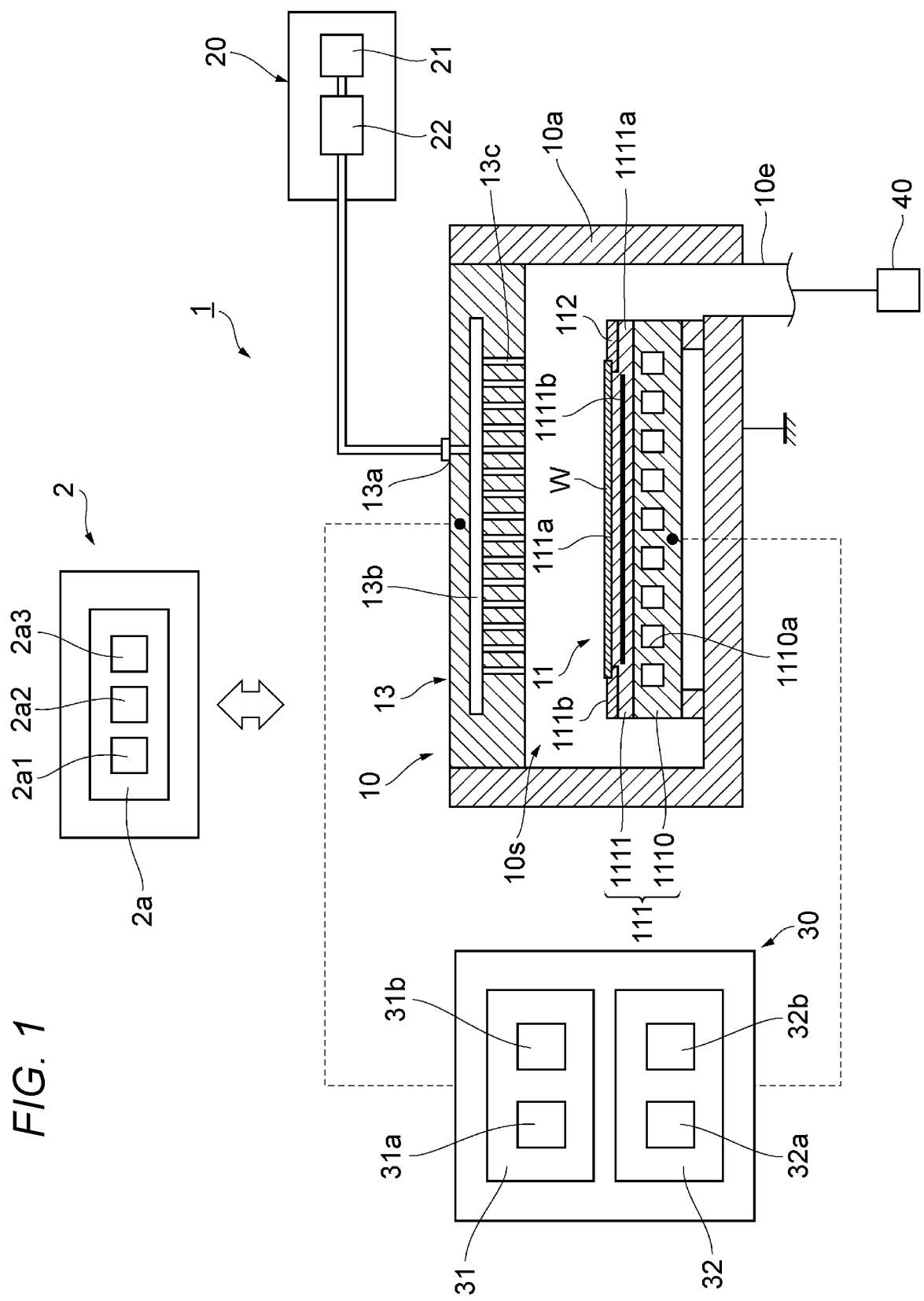
FIG. 1 is a schematic view of an exemplary plasma processing apparatus system.

Hereinafter, embodiments of the present disclosure will be described.

One exemplary embodiment provides a plasma processing method executed by a plasma processing apparatus with a chamber. The plasma processing method includes (a) providing in the chamber a substrate that includes an etching film and a mask film, the substrate including a first region where the etching film is exposed and a second region where the mask film is exposed, (b) supplying into the chamber a processing gas including a carbon-containing gas to generate plasma from the processing gas to etch the etching film and to form a protective film on the mask film, and (c) supplying the processing gas into the chamber to generate plasma from the processing gas to further etch the etching film and to remove at least part of the protective film, wherein (b) includes a first period and a second period, and a flow rate of the carbon-containing gas in the first period is greater than a flow rate of the carbon-containing gas in the second period, and (c) includes a third period and a fourth period, and a flow rate of the carbon-containing gas in the third period is less than the flow rate of the carbon-containing gas in the second period and a flow rate of the carbon-containing gas in the fourth period.

In one exemplary embodiment, the mask film is disposed on the etching film, the mask film has an upper surface and a side surface, the upper surface covering the etching film in the second region, and a side surface defining an opening through which the etching film is exposed in the first region, (b) includes etching the etching film to form a recessed portion in the etching film in the first region, and forming the protective film on the upper surface, the side surface, and the recessed portion of the mask film, and (c) includes removing at least part of the protective film.

In one exemplary embodiment, the flow rate of the carbon-containing gas in the fourth period is less than the flow rate of the carbon-containing gas in the second period.

In one exemplary embodiment, during a transition from one period to another period among the first period to the fourth period, the flow rate of the carbon-containing gas changes continuously or stepwise.

In one exemplary embodiment, the plasma processing apparatus further includes a substrate support in the chamber, (a) includes providing the substrate onto the substrate support, and (b) and (c) include supplying a bias signal to the substrate support.

In one exemplary embodiment, in (b) and (c) an effective value of power of the bias signal is constant.

In one exemplary embodiment, in (b), an effective value of power of the bias signal in the first period is greater than an effective value of power of the bias signal in the second period.

In one exemplary embodiment, in (c), an effective value of power of the bias signal in the third period is less than an effective value of power of the bias signal in the fourth period.

In one exemplary embodiment, during the transition from one period to another period among the first period to the fourth period, the effective value of the power of the bias signal changes continuously or stepwise.

In one exemplary embodiment, (b) includes supplying a source RF signal to the chamber to generate the plasma, and an effective value of power of the source RF signal in the first period is less than an effective value of power of the source RF signal in the second period.

In one exemplary embodiment, (c) includes supplying a source RF signal to the chamber to generate the plasma, and an effective value of power of the source RF signal in the third period is greater than an effective value of power of the source RF signal in the fourth period.

In one exemplary embodiment, the processing gas includes an oxygen-containing gas, and in (b), a flow rate of the oxygen-containing gas in the first period is greater than a flow rate of the oxygen-containing gas in the second period.

In one exemplary embodiment, in (c), a flow rate of the oxygen-containing gas in the third period is less than a flow rate of the oxygen-containing gas in the fourth period.

In one exemplary embodiment, the substrate further includes an underlying film, the etching film is disposed at least in the first region, and the mask film is disposed to be adjacent to the etching film at least in the second region in a direction perpendicular to a direction in which the etching film is etched.

In one exemplary embodiment, the etching film is a silicon oxide film or a silicon nitride film.

In one exemplary embodiment, the mask film includes at least one of a boron-containing silicon film, a carbon-containing film, a nitrogen-containing film, and a tungsten silicon film.

In one exemplary embodiment, the carbon-containing gas is $C_aF_b$ (a and b are integers of 1 or more) gas or $C_cH_dF_e$ (c, d, and e are integers of 1 or more) gas.

In one exemplary embodiment, (b) and (c) are repeated a plurality of times.

In one exemplary embodiment, in at least part of the first period to the fourth period, a peak portion of the protective film formed on the side surface of the mask film shifts in a direction in which the etching film is etched.

One exemplary embodiment provides a plasma processing method executed by a plasma processing apparatus with a chamber. The plasma processing method includes (a) providing in the chamber a substrate, which includes a first region having a portion where an etching film is exposed and a second region where a mask film is exposed, (b) supplying a processing gas including a carbon-containing gas at a first flow rate into the chamber to generate plasma to etch the etching film and to form a protective film on the mask film, (c) supplying a processing gas including a carbon-containing gas at a second flow rate less than the first flow rate into the chamber to generate plasma to further etch the etching film and to form the protective film on the mask film, (d) supplying a processing gas including a carbon-containing gas at a third flow rate into the chamber to generate plasma to further etch the etching film and to remove a part of the protective film on the mask film, and (e) supplying a carbon-containing gas at a fourth flow rate that is less than the second flow rate and greater than the third flow rate into the chamber to generate to further etch the etching film and to further remove the protective film on the mask film.

In one exemplary embodiment, a plasma processing system including a chamber, a processing gas supply, a plasma generator, and a controller is provided. In the plasma processing system, the controller execute a control of (a) providing in the chamber a substrate that includes an etching film and a mask film, (b) supplying, by the processing gas supply, a processing gas including a carbon-containing gas into the chamber to generate, by the plasma generator, plasma from the processing gas to etch the etching film and to form a protective film on the mask film, and (c) supplying, by the processing gas supply, the processing gas into the chamber to generate, by the plasma generator, the plasma from the processing gas to further etch the etching film and to remove at least part of the protective film, wherein the substrate includes a first region where the etching film is exposed and a second region where the mask film is exposed, (b) includes a first period and a second period, and a flow rate of the carbon-containing gas in the first period is greater than a flow rate of the carbon-containing gas in the second period, and (c) includes a third period and a fourth period, and a flow rate of the carbon-containing gas in the third period is less than the flow rate of the carbon-containing gas in the second period and a flow rate of the carbon-containing gas in the fourth period.

Configuration Example of Plasma Processing System

Hereinafter, an example of the configuration example of a plasma processing system will be described. FIG. 1 is a view for explaining an example of a configuration of a capacitively-coupled plasma processing apparatus.

The plasma processing system includes a capacitively-coupled plasma processing apparatus 1 and a controller 2. The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas into the plasma processing space 10s, and at least one gas exhaust port for exhausting the gas from the plasma processing space. The plasma processing chamber 10 is grounded. The shower head 13 and the substrate support 11 are electrically insulated from a housing of the plasma processing chamber 10.

The substrate support 11 includes a main body 111 and a ring assembly 112. The main body portion 111 has a central region 111a for supporting the substrate W and an annular region 111b for supporting the ring assembly 112. The wafer is an example of the substrate W. The annular region 111b of the main body 111 surrounds the central region 111a of the main body 111 in a plan view. The substrate W is disposed on the central region 111a of the main body 111 and the ring assembly 112 is disposed on the annular region 111b of the main body 111 to surround the substrate W on the central region 111a of the main body 111. Accordingly, the central region 111a is also referred to as a substrate support surface for supporting the substrate W, and the annular region 111b is also referred to as a ring support surface for supporting the ring assembly 112.

In one embodiment, the main body 111 includes a base 1110 and an electrostatic chuck 1111. The base 1110 includes a conductive member. The conductive member of the base 1110 functions as a lower electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a has a central region 111a. In one embodiment, the ceramic member 1111a also has an annular region 111b. Other members that surround the electrostatic chuck 1111, such as an annular electrostatic chuck and an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power source 31 and/or a direct current (DC) power source 32 to be described below may be disposed inside the ceramic member 1111a. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111b may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110a, or a combination thereof. A heat transfer fluid, such as brine or gas, flows through the flow path 1110a. In one embodiment, the flow path 1110a is formed inside the base 1110, and one or more heaters are disposed in the ceramic member 1111a of the electrostatic chuck 1111. Further, the substrate support 11 may include a heat transfer gas supply configured to supply a heat transfer gas to a gap between the rear surface of the substrate W and the central region 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. The gas introduction unit may include, in addition to the shower head 13, one or a plurality of side gas injectors (SGI) that are attached to one or a plurality of openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power) to at least one lower electrode and/or at least one upper electrode. As a result, plasma is formed from at least one processing gas supplied into the plasma processing space 10s. Accordingly, the RF power source 31 may function as at least a portion of a plasma generator configured to generate plasma from one or more processing gases in the plasma processing chamber 10. Further, by supplying the bias RF signal (bias signal) to the at least one lower electrode, a bias potential (bias power) is generated in the substrate W, making it possible to draw ion components in the formed plasma into the substrate W.

In one embodiment, the RF power source 31 includes a first RF generator 31a and a second RF generator 31b. The first RF generator 31a is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHz. In one embodiment, the first RF generator 31a may be configured to generate a plurality of source RF signals having different frequencies. The generated one or more source RF signals are supplied to at least one lower electrode and/or at least one upper electrode.

The second RF generator 31b is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31b may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is configured to be connected to at least one lower electrode to generate the first DC signal. The generated first bias DC signal is applied to at least one lower electrode. In one embodiment, the second DC generator 32b is configured to be connected to at least one upper electrode to generate a second DC signal. The generated second DC signal is applied to at least one upper electrode.

In various embodiments, at least one of the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator 32a and at least one lower electrode. Accordingly, the first DC generator 32a and the waveform generator configure a voltage pulse generator. In a case where the second DC generator 32b and the waveform generator configure the voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include a processor 2a1, a storage unit 2a2, and a communication interface 2a3. The controller 2 is implemented by, for example, a computer 2a. The processor 2a1 may be configured to read a program from the storage unit 2a2 and perform various control operations by executing the read program. The program may be stored in advance in the storage unit 2a2, or may be acquired via a medium when necessary. The acquired program is stored in the storage unit 2a2, and is read from the storage unit 2a2 and executed by the processor 2a1. The medium may be various storing media readable by the computer 2a, or may be a communication line connected to the communication interface 2a3. The processor 2a1 may be a Central Processing Unit (CPU). The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 2:
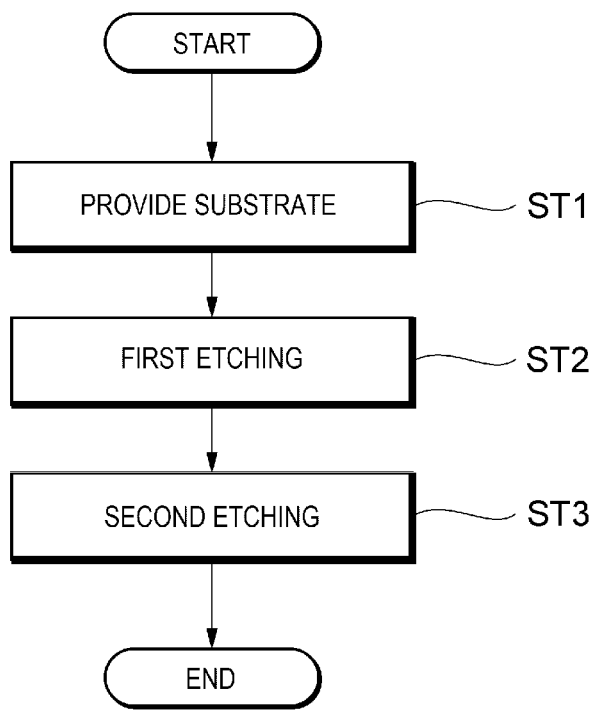
FIG. 2 is a flowchart illustrating the present processing method.

FIG. 2 is a flowchart illustrating a plasma processing method (hereinafter, also referred to as a "present processing method") according to one exemplary embodiment. As illustrated in FIG. 2, the present processing method includes step ST1 for providing a substrate, a first etching step ST2, and a second etching step ST3. Processing in each step may be executed by the plasma processing system illustrated in FIG. 1. Hereinafter, a case where the controller 2 controls each part of the plasma processing apparatus 1 to execute the present processing method for the substrate W will be described by way of an example.

Step ST1: Provision of Substrate

In step ST1, the substrate W is provided in the plasma processing space 10s of the plasma processing apparatus 1. The substrate W is provided in the central region 111a of the substrate support 11. Then, the substrate W is held by the substrate support 11 by the electrostatic chuck 1111.

Figure 3:
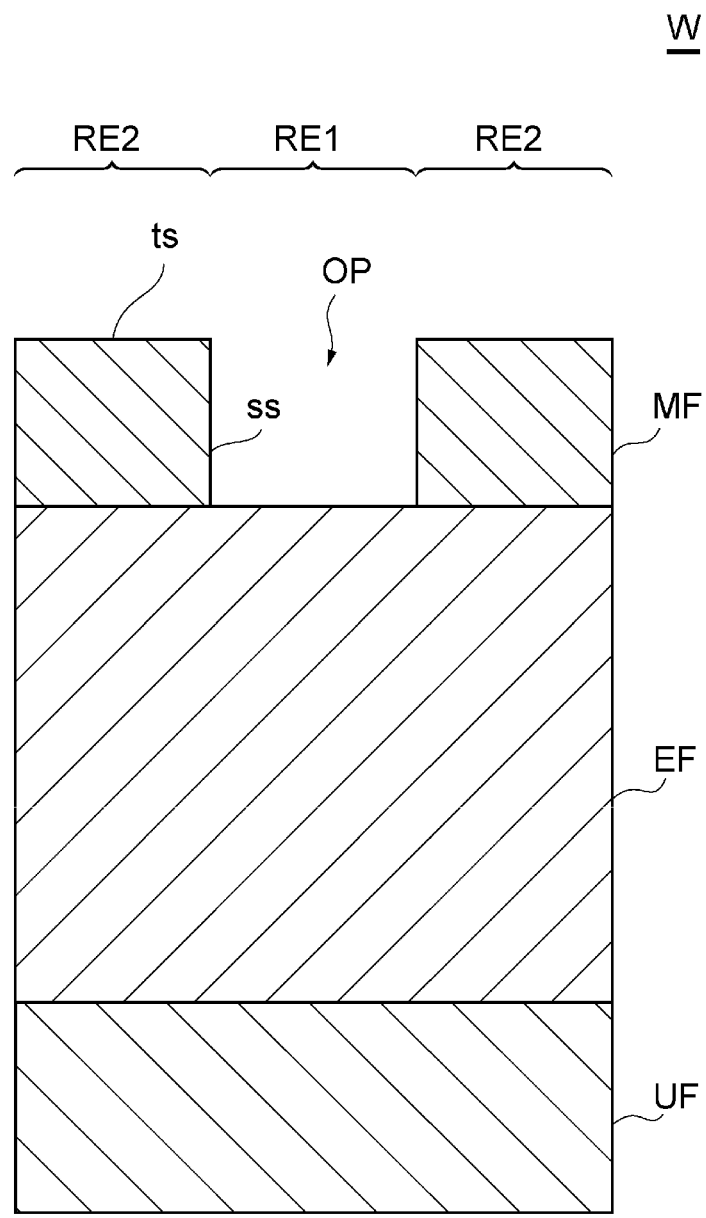
FIG. 3 is a view schematically illustrating an example of a cross-sectional structure of a substrate W provided in step ST1.

FIG. 3 is a view illustrating an example of a cross-sectional structure of the substrate W provided in step ST1. In the substrate W, an etching film EF and a mask film MF are stacked in this order on an underlying film UF. The substrate W may be used for manufacturing a semiconductor device. The semiconductor device includes, for example, a semiconductor memory device, such as a DRAM or a 3D-NAND flash memory.

The underlying film UF may be, for example, a silicon wafer, or an organic film, a dielectric film, a metal film, a semiconductor film, or the like formed on the silicon wafer. The underlying film UF may be configured to include a stacked film.

The etching film EF is a film that is a target of etching in the present processing method. In one example, the etching film EF is a silicon-containing film. In one example, the silicon-containing film is a silicon oxide film, a silicon nitride film, or the like. Further, the etching film EF may be a multilayer film composed of two or more layer films.

The mask film MF is a film that functions as a mask in etching of the etching film EF. In one example, the mask film MF may be a carbon-containing film or a silicon-containing film. The silicon-containing film may be, for example, a silicon film or may be a film containing a metal or a non-metal. The metal may include tungsten. The non-metal may include boron. The mask film MF may be a monolayer mask composed of one layer or a multilayer mask composed of two or more layers. Further, the mask film MF may include an organic film. In one example, the organic film is a photoresist film.

As illustrated in FIG. 3, the mask film MF has at least one opening OP. The opening OP is provided in a region RE1. The opening OP is a space above the etching film EF and surrounded by a side surface ss of the mask film MF. That is, in FIG. 3, a part of an upper surface of the etching film EF has a portion exposed in the opening OP. That is, the etching film EF is exposed in the region RE1. Further, the etching film EF is covered with the mask film MF in a region RE2. The upper surface of the etching film EF is a surface on which the etching film EF is in contact with the mask film MF. The opening OP may have any shape in a plan view of the substrate W (when the substrate W is viewed in a direction from above to below in FIG. 3). The shape may be, for example, a circular shape, an elliptical shape, a rectangular shape, or a linear shape. Further, the shape may be a combination of one or more types of these shapes. The mask film MF may have a plurality of openings OP. In one example, each of the plurality of openings OP may have a hole shape. Then, the plurality of openings OP having a hole shape may be arranged at a regular interval to configure an array pattern. Further, each of the plurality of openings OP may have a linear shape. Further, the plurality of openings OP having a linear shape may be arranged at regular intervals to form a line and space pattern.

The region RE1 in FIG. 3 is an example of a first region. Further, the region RE2 is an example of a second region. The region RE1 is a region where the etching film EF is exposed in a plan view of the substrate W. Further, the region RE2 is a region where the mask film MF is exposed in a plan view of the substrate W. That is, the region RE2 is a region where the mask film MF covers the etching film EF in a plan view of the substrate W.

Each of the films (the underlying film UF, the etching film EF, and the mask film MF) included in the substrate W may be formed by a chemical vapor deposition (CVD) method, an atomic layer deposition (ALD) method, a spin coating method, or the like. Each of the above-described films may be a flat film or a film having unevenness. The opening OP may be formed by etching the mask film MF. The substrate W may further have another film below the underlying film UF, and a stacked film of the etching film EF and the underlying film UF may function as a multilayer mask. That is, the another film may be etched by using the stacked film of the etching film EF and the underlying film UF as a multilayer mask.

At least some of the processes of forming the films of the substrate W may be performed in a space of the plasma processing chamber 10. In one example, a step of etching the mask film MF to form the opening OP may be executed in the plasma processing chamber 10. That is, etching of the opening OP and etching of the etching film EF to be described below may be consecutively executed inside the same chamber. Further, after all or some of the films of the substrate W are formed by an apparatus or a chamber outside the plasma processing apparatus 1, the substrate W may be carried into the plasma processing space 10s and disposed in the central region 111a of the substrate support 11, and thereby, the substrate may be provided.

Step ST2: First Etching

In step ST2, the etching film EF is etched. The etching film EF is etched by the plasma generated from a processing gas supplied to the plasma processing chamber 10. That is, first, the processing gas is supplied from the gas supply 20 into the plasma processing space 10s. Then, the source RF signal is supplied to a lower electrode of the substrate support 11. In this way, a radio-frequency electric field is generated between the shower head 13 and the substrate support 11, so that plasma is generated from the processing gas in the plasma processing space 10s. Further, a bias RF signal (a bias signal) is supplied to a lower electrode (a bias electrode) of the substrate support 11, and thereby, a bias potential (bias power) is generated between the plasma and the substrate W. Active species, such as ions and radicals in the plasma are drawn into the substrate W by the bias potential, and the etching film EF is etched by the active species.

The present processing method has a first period to a fourth period as illustrated in FIGS. 6A to 7C to be described below. As illustrated in FIGS. 6A to 7C, step ST2 includes a first period and a second period. In both the first period and the second period, the etching film EF is etched. Further, in each of the first period and the second period, the etching film EF is etched under different etching conditions.

Figure 4A:
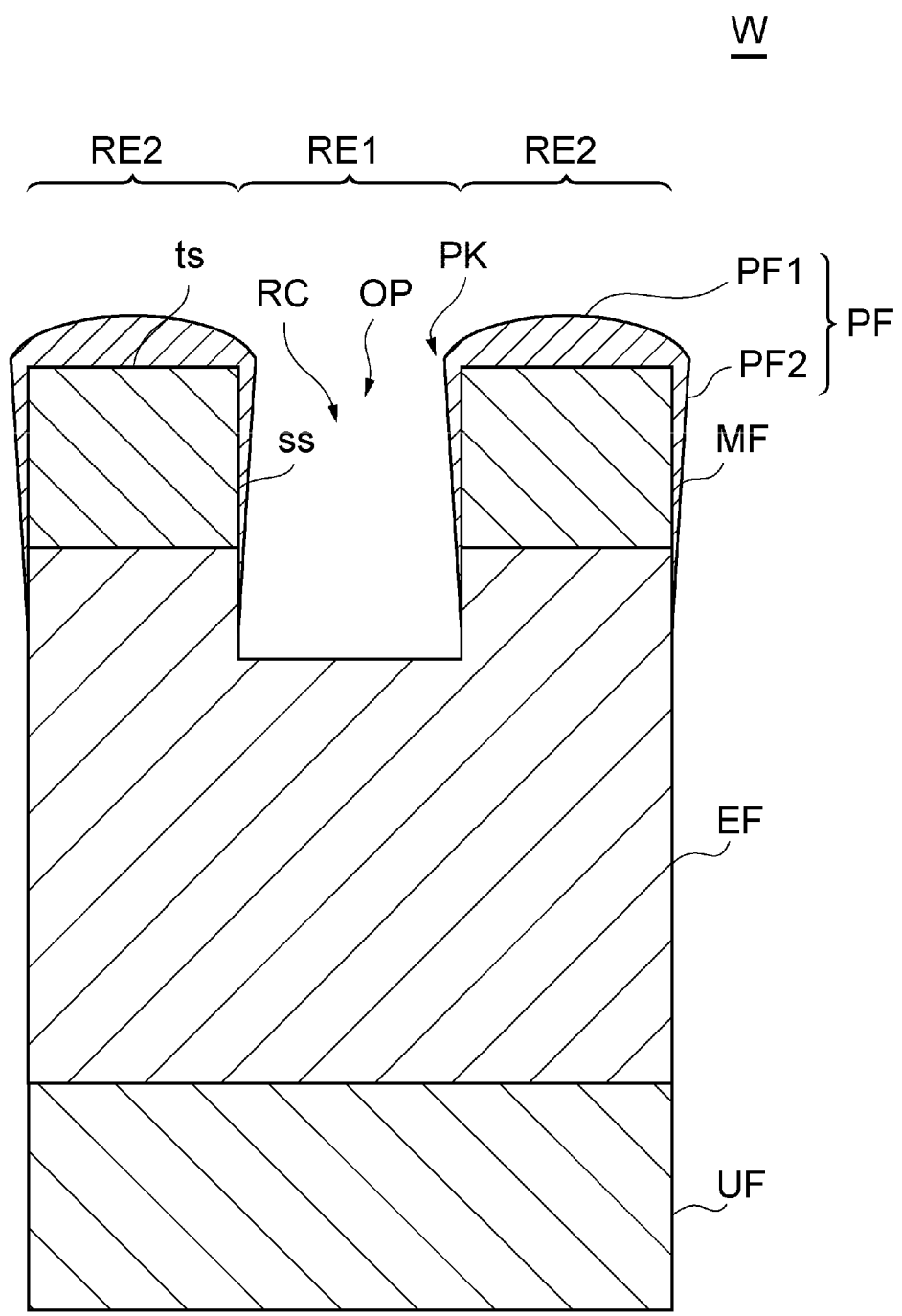
FIG. 4A is a view schematically illustrating an example of a cross-sectional structure of the substrate W after processing in a first period of step ST2.

FIG. 4A is a view illustrating an example of a cross-sectional structure of the substrate W after the processing of the first period in step ST2. In step ST2, an exposed portion of the etching film EF in the opening OP is etched in a depth direction (a direction from an upper side to a lower side in FIG. 4A) to form a recessed portion RC. The recessed portion RC is a space surrounded by a sidewall of the etching film EF. Further, the sidewall is continuous from the side surface ss of the mask film MF. Further, a protective film PF generated during the etching is formed on an upper surface ts of the mask film, the side surface ss of the mask film, and a part of the recessed portion RC. The protective film PF may protect the mask film MF during the etching of the etching film EF. The protective film PF includes a protective film PF1 formed on the upper surface ts of the mask film, and a protective film PF2 formed on the side surface ss of the mask film. Further, the protective film PF2 may be formed from the side surface ss to at least a part of the recessed portion RC. The protective film PF may be a deposit generated from a carbon-containing gas contained in the processing gas. Further, the protective film PF may be a deposit including by-products generated by the etching of the etching film EF.

The processing gas includes a carbon-containing gas. The carbon-containing gas contributes to at least the deposition of the protective film PF. That is, a product generated by plasma from the carbon-containing gas may be deposited to form the protective film PF. When a flow rate of the carbon-containing gas in the processing gas increases, a deposition speed of the protective film PF may become higher than a removal speed of the protective film PF by an oxygen-containing gas to be described below. The carbon-containing gas is represented as $C_aF_b$ (a and b are integers of 1 or more) gas or $C_cH_dF_e$ (c, d, and e are integers of 1 or more) gas, and at least one selected from the group consisting of, for example, $CF_4$ gas, $C_2F_6$ gas, $C_2F_4$ gas, $C_3F_8$ gas, $C_4F_8$ gas, $CH_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, $C_5H_3F_7$ gas, and the like may be used therefor.

Further, the processing gas includes an etching gas. The etching gas mainly contributes to etching of the etching film EF. For example, at least one type selected from the group consisting of HF gas, $NF_3$ gas, and $WF_6$ gas, which contain fluorine, may be used as the etching gas. Further, the carbon-containing gas may contribute to the etching of the etching film EF. That is, the etching film EF may be etched by an active species generated from the carbon-containing gas by plasma. In one example, the active species includes an active species of fluorine.

Further, the processing gas includes an oxygen-containing gas. The oxygen-containing gas may contribute to removal of the protective film PF deposited during etching. When a flow rate of the oxygen-containing gas in the processing gas increases, a removal speed of the protective film PF may be higher than a deposition speed of the protective film PF. The oxygen-containing gas is an gas containing oxygen and may be at least one type selected from the group consisting of, for example, $O_2$ gas, CO gas, and $CO_2$ gas. Further, the processing gas may further include an inert gas such as Ar.

Figure 4B:
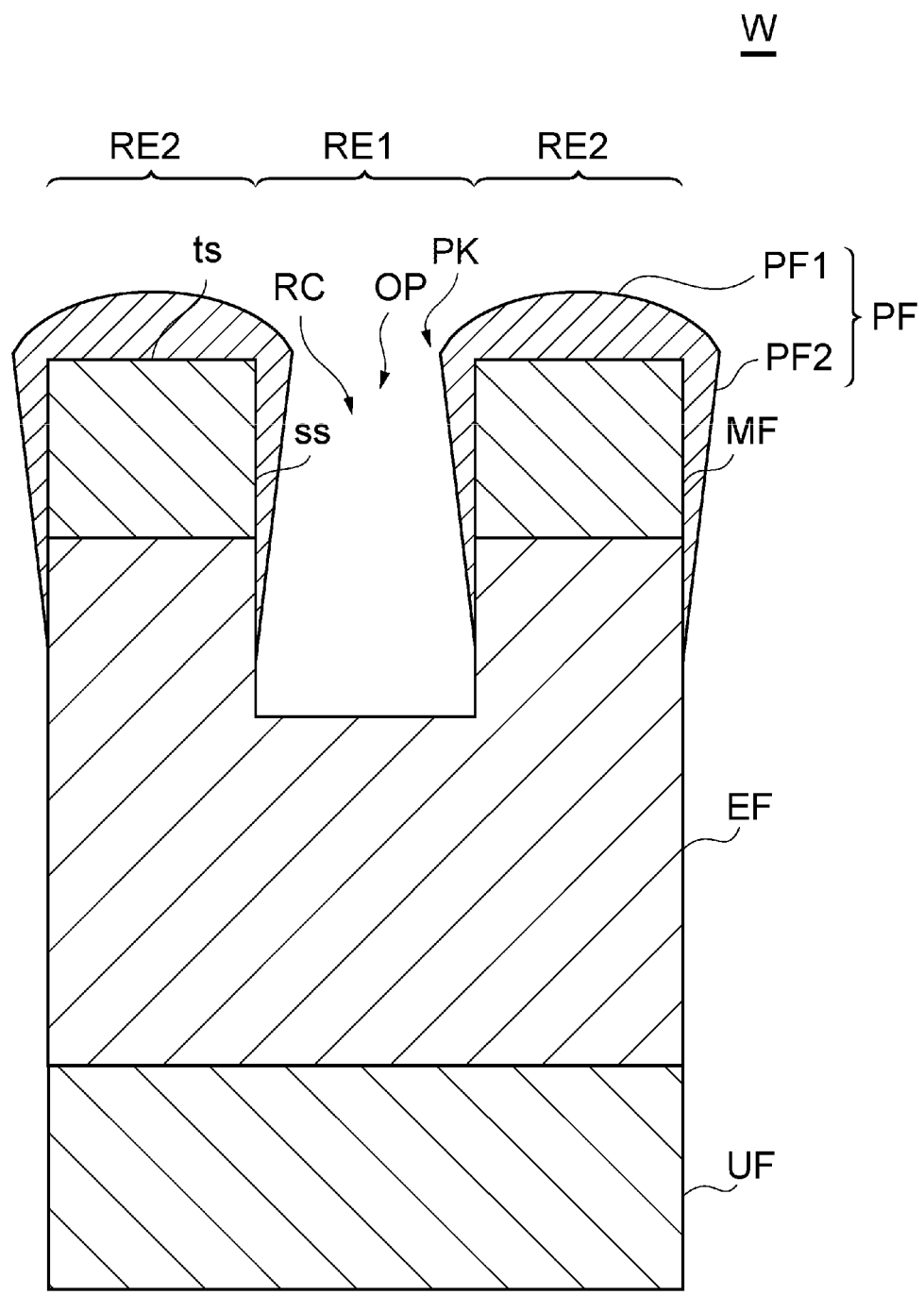
FIG. 4B is a view schematically illustrating an example of a cross-sectional structure of the substrate W after processing in a second period of step ST2.

FIG. 4B is a view illustrating an example of a cross-sectional structure of the substrate W after the processing in the second period in step ST2. In the same manner as in the processing in the first period in step ST2, plasma is generated from processing gas and the etching film EF is etched in the plasma processing space 10s. As a result, the etching film EF is further etched. That is, a recessed portion RC of the etching film EF in FIG. 4B is deeper than the recessed portion RC of FIG. 4A.

In the first period and the second period, formation of the protective film PF is advanced as etching of the etching film EF is advanced. That is, in the first period and the second period, both the formation of the protective film PF and the removal of the protective film PF may occur. Then, in the first period and the second period, a flow rate of the carbon-containing gas and a flow rate of the oxygen-containing gas are controlled such that a deposition speed of the protective film PF exceeds a removal speed of the protective film PF. Further, the deposition speed of the protective film PF in the second period is lower than the deposition speed of the protective film PF in the first period. In one example, the flow rate of the carbon-containing gas in the second period is less than the flow rate of the carbon-containing gas in the first period, and the deposition speed of the protective film PF in the second period is lower than the deposition speed of the protective film PF in the first period. Further, the removal speed of the protective film PF in the second period is lower than the removal speed of the protective film PF in the first period. In one example, the flow rate of the oxygen-containing gas in the second period is made less than the flow rate of the oxygen-containing gas in the first period such that the removal speed of the protective film PF in the second period is lower than the removal speed of the protective film PF in the first period.

Step ST3: Second Etching

In step ST3, the etching film EF is further etched. In the same manner as in step ST2, the etching film EF is further etched by the plasma generated from the processing gas supplied to the plasma processing chamber 10.

Figure 5A:
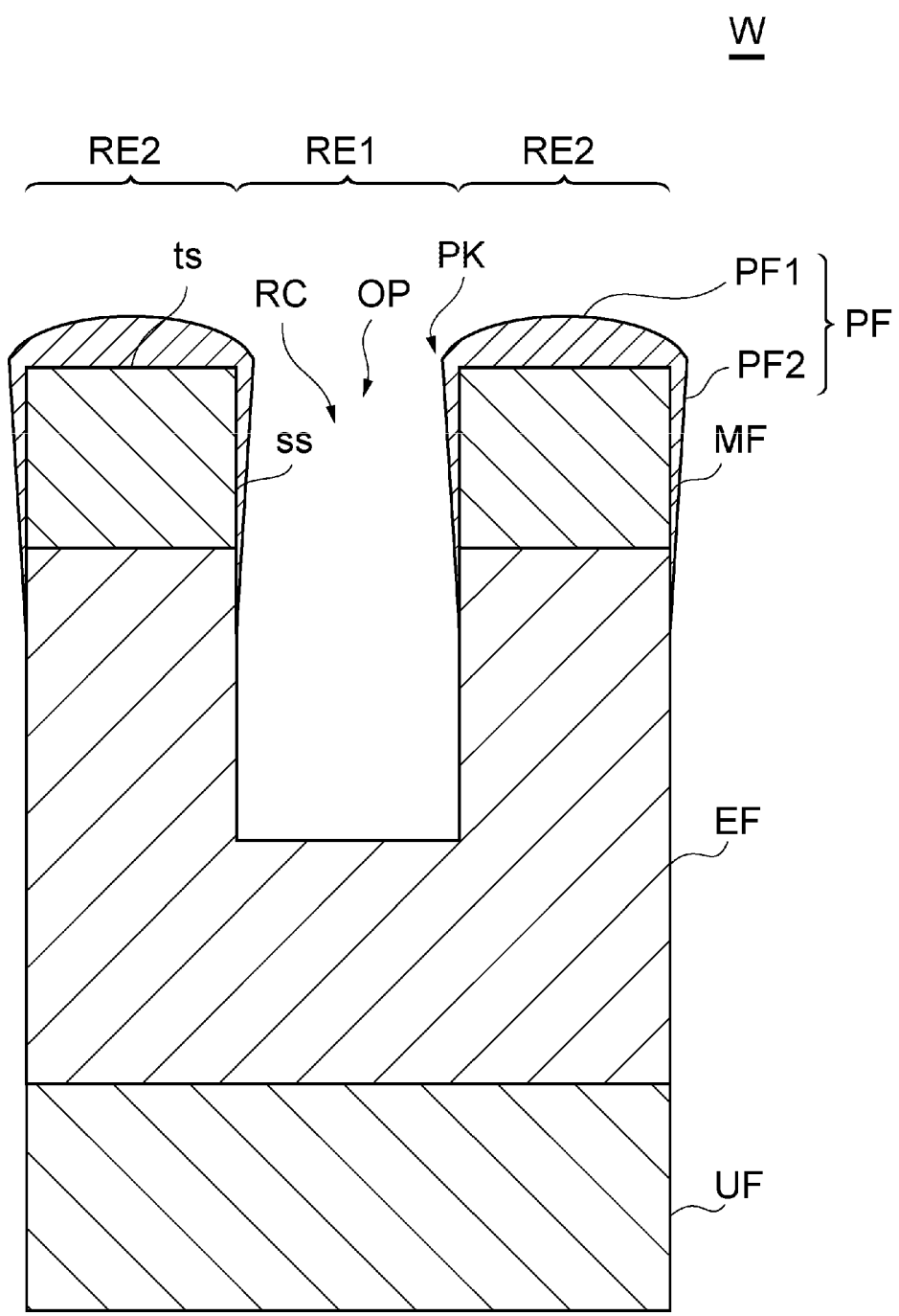
FIG. 5A is a view schematically illustrating an example of a cross-sectional structure of the substrate W after processing in a third period of step ST3.

FIG. 5A is a view illustrating an example of a cross-sectional structure of the substrate W after the processing in the third period in step ST3. In the same manner as in the processing in step ST2, a processing gas includes a carbon-containing gas, an etching gas, and an oxygen-containing gas. Plasma is generated from the processing gas supplied into the plasma processing space 10s, and an etching film EF is etched. A protective film PF1 formed on an upper surface ts of a mask film MF, and a protective film PF2 formed on a side surface ss of the mask film and on a portion of a sidewall of the etching film EF in a recessed portion RC are removed with the etching of the etching film EF. The recessed portion RC of the etching film EF in FIG. 5A is deeper than the recessed portion RC of FIG. 4B.

Figure 5B:
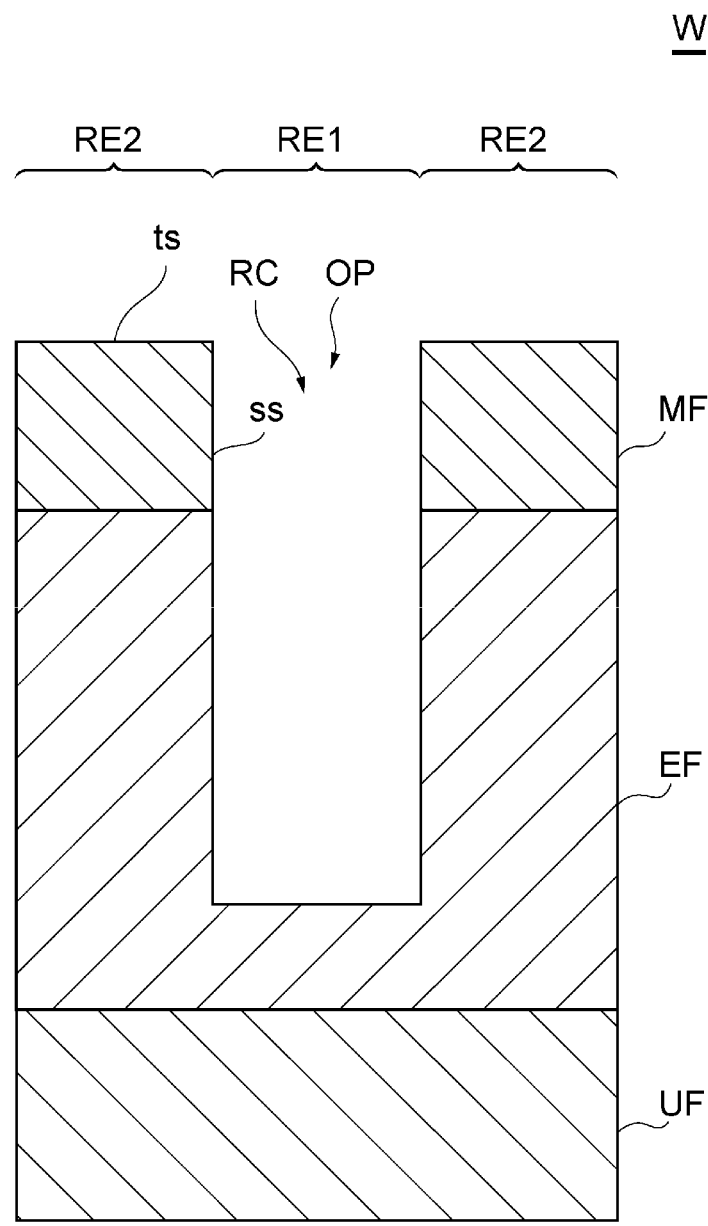
FIG. 5B is a view schematically illustrating an example of a cross-sectional structure of the substrate W after processing in a fourth period of step ST3.

FIG. 5B is a view illustrating an example of a cross-sectional structure of the substrate W during the processing in the fourth period in step ST3. In the same manner as in the processing in step ST2, a processing gas includes a carbon-containing gas, an etching gas, and an oxygen-containing gas. Plasma is generated from the processing gas supplied into the plasma processing space 10s, and an etching film EF is etched. The protective film PF1 formed on the upper surface ts of the mask film MF, and the protective film PF2 formed on the side surface ss of the mask film and on a portion of the sidewall of the etching film EF in the recessed portion RC are removed with the etching of the etching film EF. In the fourth period, a part or entirety of the protective film PF may be removed. Further, a recessed portion RC of the etching film EF in FIG. 5B is deeper than the recessed portion RC of FIG. 5A. The recessed portion RC may have a depth reaching an underlying film UF.

In the third and fourth periods, removal of the protective film PF is advanced as etching of the etching film EF is advanced. That is, in the third period and the fourth period, both the formation of the protective film PF and the removal of the protective film PF may occur. Then, in the third period and the fourth period, a flow rate of the carbon-containing gas and a flow rate of the oxygen-containing gas are controlled such that a removal speed of the protective film PF exceeds a deposition speed of the protective film PF. Further, the removal speed of the protective film PF in the fourth period is higher than the removal speed of the protective film PF in the third period. In one example, the flow rate of the oxygen-containing gas in the fourth period is made greater than the flow rate of the oxygen-containing gas in the third period, whereby necking is controlled in the fourth period. Further, the deposition speed of the protective film PF in the fourth period is higher than the deposition speed of the protective film PF in the third period. In one example, the flow rate of the carbon-containing gas in the fourth period is made greater than the flow rate of the carbon-containing gas in the third period, whereby the deposition speed of the protective film PF in the fourth period is made higher than the deposition speed of the protective film PF in the third period.

Step ST2 and Step ST3 may be repeated. The number of repetitions of step ST2 and step ST3 may be set freely. For example, with step ST2 and step ST3 set as one cycle, it may be determined whether the number of cycles reaches a preset number of repetitions, and step ST2 and step ST3 may be repeated until the number of cycles reaches the preset number of repetitions. The number of repetitions may be set based on a film thickness of the etching film EF (that is, a depth of the recessed portion RC to be formed). Further, the first cycle may start from a period other than the first period.

Figure 6A:
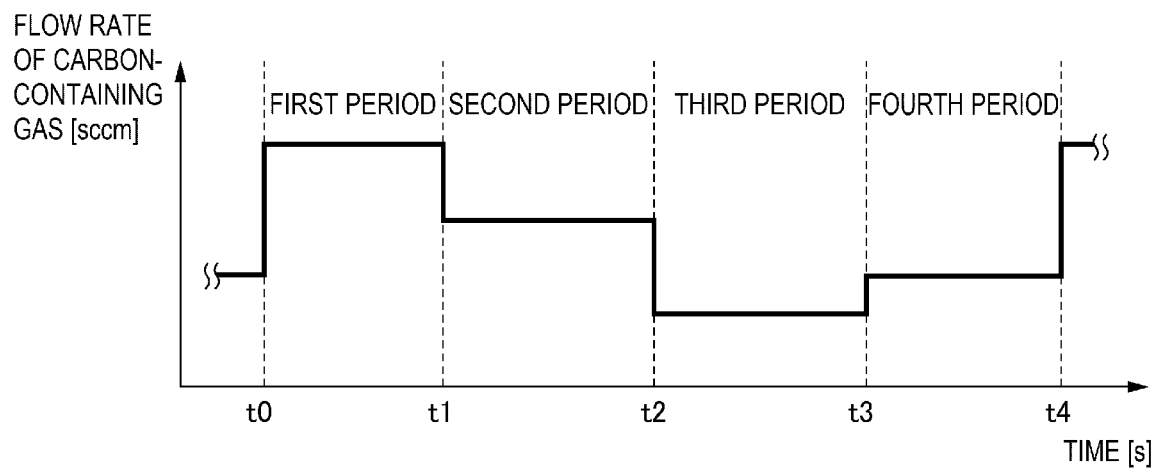
FIG. 6A is a timing chart illustrating an example of a flow rate of a carbon-containing gas in step ST2 and step ST3.
Figure 6B:
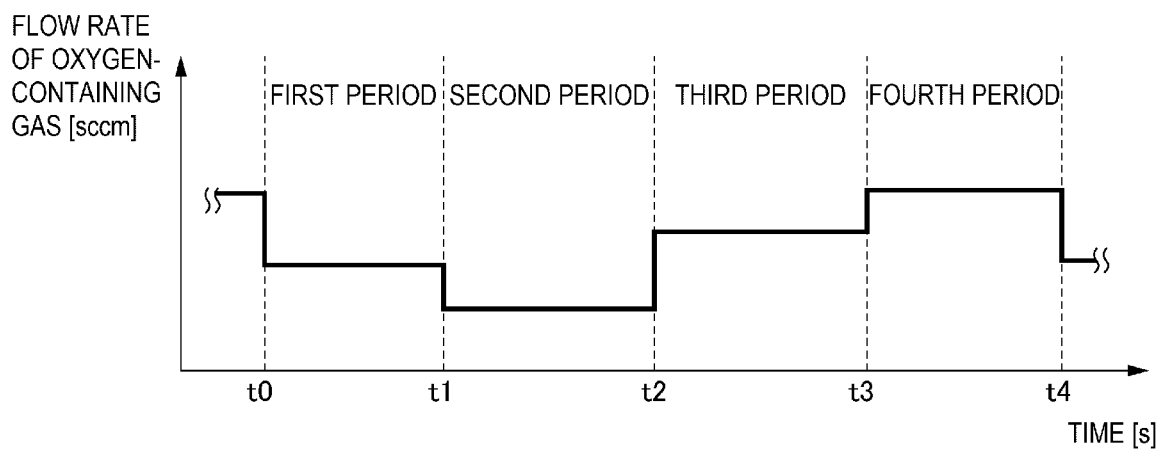
FIG. 6B is a timing chart illustrating an example of a flow rate of an oxygen-containing gas in step ST2 and step ST3.
Figure 6C:
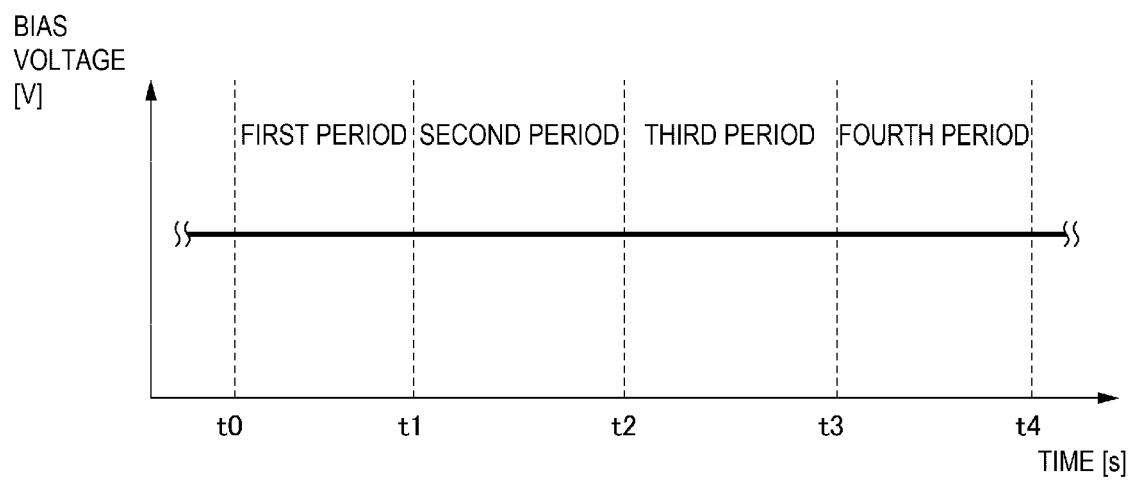
FIG. 6C is a timing chart illustrating an example of a bias voltage in step ST2 and step ST3.

FIGS. 6A, 6B, and 6C are timing charts respectively illustrating examples of a flow rate of a carbon-containing gas, a flow rate of an oxygen-containing gas, and a bias voltage, which are supplied in step ST2 and step ST3. In FIGS. 6A, 6B, and 6C, horizontal axes represent time. Further, vertical axes represent a flow rate of a carbon-containing gas, a flow rate of an oxygen-containing gas, and a bias voltage.

As illustrated in FIG. 6A, in the present example, a flow rate of a carbon-containing gas in a first period and a second period is greater than a flow rate of the carbon-containing gas in a third period and a fourth period. Further, the flow rate of the carbon-containing gas in the first period is greater than the flow rate of the carbon-containing gas in the second period. Further, the flow rate of the carbon-containing gas in the third period is less than the flow rate of the carbon-containing gas in the fourth period. Further, the flow rate of the carbon-containing gas in the fourth period is less than the flow rate of the carbon-containing gas in the second period. In this way, in the present processing method, the flow rate of the carbon-containing gas in the second period is less than the flow rate of the carbon-containing gas in the first period, and thus, deposition of the protective film PF in the second period can be suppressed. Accordingly, by controlling the necking of the protective film PF in the opening OP, ions that are obliquely incident on the opening OP can be suppressed or dispersed. Further, the flow rate of the carbon-containing gas in the fourth period is greater than the flow rate of the carbon-containing gas in the third period. Thereby, in particular, when an element for etching the etching film EF is included in the carbon-containing gas, a large amount of ions of the element can be supplied to the etching film EF in a state where the necking is reduced in the fourth period, thereby increasing an etching rate of the etching film EF.

Further, as illustrated in FIG. 6B, in the present example, the flow rate of the oxygen-containing gas in the first period is greater than the flow rate of the oxygen-containing gas in the second period. The flow rate of the oxygen-containing gas in the third period and the fourth period is greater than the flow rate of the oxygen-containing gas in the first period and the second period. Further, the flow rate of the oxygen-containing gas in the third period is greater than the flow rate of the oxygen-containing gas in the second period. Further, the flow rate of the oxygen-containing gas in the fourth period is greater than the flow rate of the oxygen-containing gas in the third period. Further, the flow rate of the oxygen-containing gas in the third period is greater than the flow rate of the oxygen-containing gas in the first period. In this way, in the present processing method, deposition and removal of the protective film PF can be controlled by controlling the flow rate of the oxygen-containing gas in each period. This can control the necking of the protective film PF in the opening OP.

Further, as illustrated in FIG. 6C, in the present example, the bias voltage is constant in a first period to a fourth period. In the present example, a bias DC signal is supplied to the substrate support 11 as an example of a bias signal. The bias voltage illustrated in FIG. 6C has a negative polarity. The bias voltage illustrated in FIG. 6C is an example of bias power. An absolute value of the bias voltage is an example of an effective value of power of the bias signal. The bias signal may be a bias RF signal. In this case, an effective value of power of the bias RF signal is an example of the effective value of the power of the bias signal. The flow rate of the carbon-containing gas and the flow rate of the oxygen-containing gas each are increased and decreased stepwise under the constant bias voltage, making it possible to etch the etching film EF while the mask film MF is protected by the protective film PF. This can improve selectivity to the mask film MF.

Figure 7A:
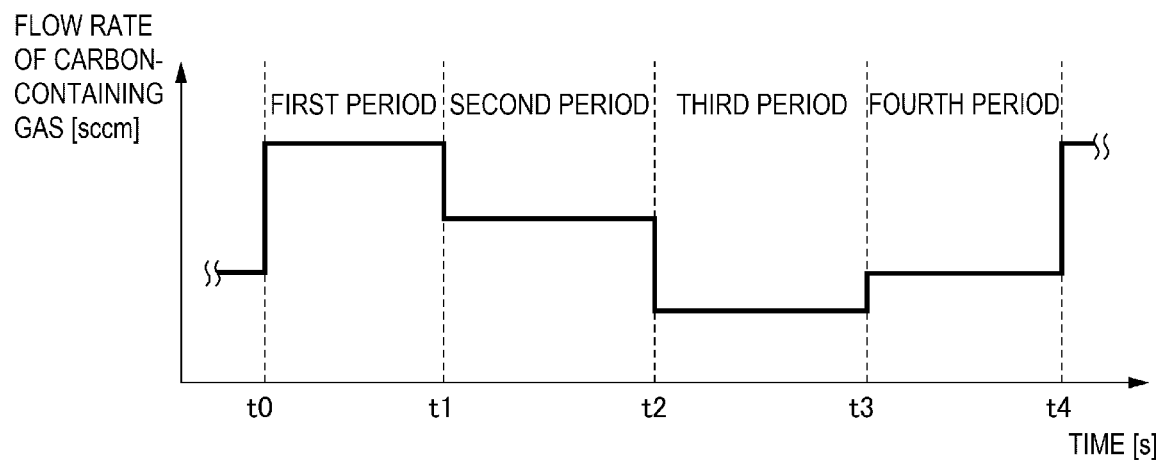
FIG. 7A is a timing chart illustrating another example of the flow rate of the carbon-containing gas in step ST2 and step ST3.
Figure 7B:
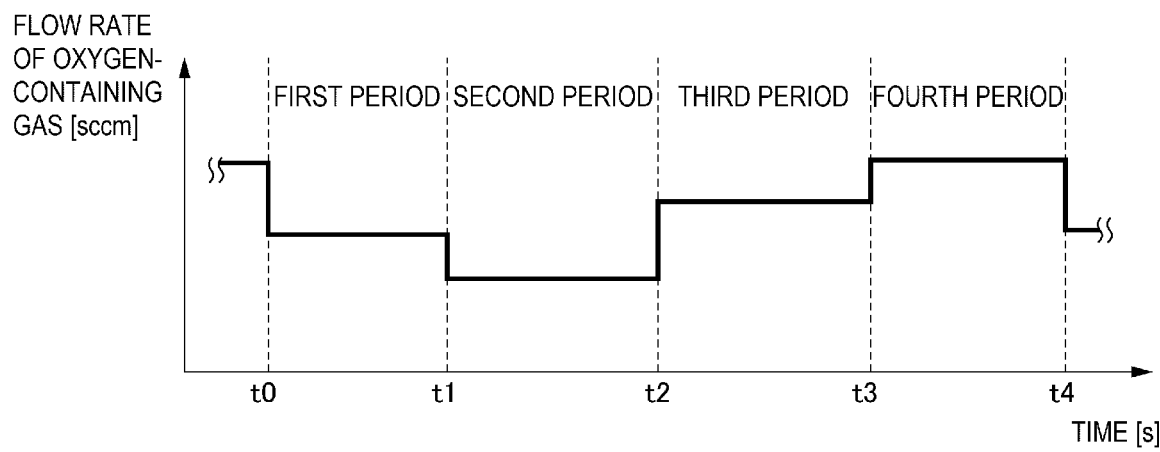
FIG. 7B is a timing chart illustrating another example of the flow rate of the oxygen-containing gas in step ST2 and step ST3.
Figure 7C:
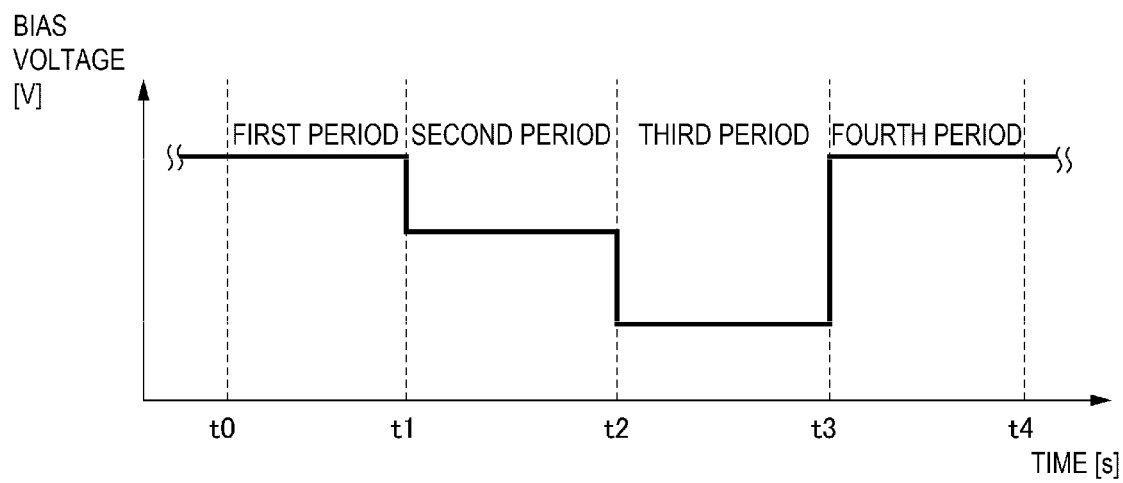
FIG. 7C is a timing chart illustrating another example of the bias voltage in step ST2 and step ST3.

FIGS. 7A, 7B, and 7C are timing charts respectively illustrating other examples of the flow rate of the carbon-containing gas, the flow rate of the oxygen-containing gas, and the bias voltage in step ST2 and step ST3. In FIGS. 7A, 7B, and 7C, horizontal axes represent time. Further, vertical axes represent the flow rate of the carbon-containing gas, the flow rate of the oxygen-containing gas, and an absolute value of the bias voltage.

As illustrated in FIG. 7A, in the present example, the flow rate of the carbon-containing gas in a first period and a second period is greater than the flow rate of the carbon-containing gas in a third period and a fourth period. Further, the flow rate of the carbon-containing gas in the first period is greater than the flow rate of the carbon-containing gas in the second period. Further, the flow rate of the carbon-containing gas in the third period is less than the flow rate of the carbon-containing gas in the fourth period. Further, the flow rate of the carbon-containing gas in the fourth period is less than the flow rate of the carbon-containing gas in the second period.

Further, as illustrated in FIG. 7B, in the present example, the flow rate of the oxygen-containing gas in the first period is greater than the flow rate of the oxygen-containing gas in the second period. The flow rate of the oxygen-containing gas in the third period and the fourth period is greater than the flow rate of the oxygen-containing gas in the first period and the second period. Further, the flow rate of the oxygen-containing gas in the third period is greater than the flow rate of the oxygen-containing gas in the second period. Further, the flow rate of the oxygen-containing gas in the fourth period is greater than the flow rate of the oxygen-containing gas in the third period. Further, the flow rate of the oxygen-containing gas in the third period is greater than the flow rate of the oxygen-containing gas in the first period.

As illustrated in FIG. 7C, in the present example, the absolute value of the bias voltage changes stepwise in the first period to the fourth period. In the present example, a bias DC signal is supplied to the substrate support 11 as an example of a bias signal. The bias voltage illustrated in FIG. 7C may have a negative polarity. The bias voltage illustrated in FIG. 7C is an example of bias power. An absolute value of the bias voltage is an example of an effective value of power of the bias signal. The bias signal may be a bias RF signal. In this case, an effective value of power of the bias RF signal is an example of the effective value of the power of the bias signal. In the present example, the absolute values of the bias voltage in the first period and the second period is higher than the absolute value of the bias voltage in the third period and the fourth period. Further, the absolute value of the bias voltage in the first period is higher than the absolute value of the bias voltage in the second period. Further, the absolute value of the bias voltage in the third period is lower than the absolute value of the bias voltage in the fourth period. Further, the absolute value of the bias voltage in the fourth period is equal to the absolute value of the bias voltage in the first period. The absolute value of the bias voltage in the fourth period may be higher or lower than the absolute value of the bias voltage in the first period. By increasing or decreasing stepwise the bias voltage in the same manner as the flow rate of the carbon-containing gas, selectivity to the mask film MF may be further improved while a protective effect of the protective mask PF to the mask film MF is improved. Further, in the present example, necking of the protective film PF in the opening OP can be controlled by causing the absolute value of the bias voltage in the second period to be less than the absolute value of the bias voltage in the first period. Control of the necking of the protective film PF may include, for example, shifting a peak portion PK of the necking in the etching direction, or changing a thickness or a width of the necking. Further, in the present example, the absolute value of the bias voltage in the fourth period is greater than the absolute value of the bias voltage in the third period. Thereby, in a state where the necking is reduced in the fourth period, energy of ions may increase, and thus, an etching rate of the etching film EF may be improved. Further, since the necking is reduced in the fourth period, the ions are less likely to be scattered even when the absolute value of the bias voltage is increased.

An effective value of power of a source RF signal may be controlled in the first to fourth periods. In one example, the effective value of the power of the source RF signal in the first period may be greater than the effective value of the power of the source RF signal in the second period. Further, the effective value of the power of the source RF signal in the third period may be greater than the effective value of the power of the source RF signal in the second period. Further, the effective value of the power of the source RF signal in the fourth period may be greater than the effective value of the power of the source RF signal in the third period. Further, the effective value of the power of the source RF signal in the third period may be greater than the effective value of the power of the source RF signal in the first period. In this way, in the present processing method, by controlling the effective value of the power of the source RF signal in each period, the amount of ions generated from the carbon-containing gas can be controlled, and thereby, deposition and removal of the protective film PF can be controlled. This can control the necking of the protective film PF in the opening OP.

The number of periods and lengths of the periods included in each cycle may be appropriately determined according to an etching condition. The etching condition includes, as an example, types of the mask film MF and the etching film EF, types of gases included in the processing gas, effective values of powers of the source RF signal and the bias signal, and the like. Further, a flow rate of a gas in each period, the effective values of the powers of the source RF signal and the bias signal, a length of the periods, and the like may be appropriately determined according to a target and a purpose of the etching.

In the first period to the fourth period, during the transition from one period to another period, a flow rate of a carbon-containing gas may be changed stepwise from a flow rate in one period to a flow rate in another period. Further, in the first period to the fourth period, during the transition from one period to another period, the flow rate of the carbon-containing gas may be continuously changed from the flow rate in one period to the flow rate in another period. That is, the flow rate of the carbon-containing gas may be immediately changed at t0, t1, t2, t3, and/or t4 or may be gradually changed stepwise or continuously.

In the first period to the fourth period, during the transition from one period to another period, a flow rate of an oxygen-containing gas may be changed stepwise from a flow rate in one period to a flow rate in another period. Further, in the first period to the fourth period, during the transition from one period to another period, the flow rate of the oxygen-containing gas may be continuously changed from the flow rate in one period to the flow rate in another period. That is, the flow rate of the oxygen-containing gas may be immediately changed at t0, t1, t2, t3, and/or t4 or may be gradually changed stepwise or continuously.

In the first period to the fourth period, during the transition from one period to another period, a bias voltage may be changed stepwise from a voltage in one period to a voltage in another period. Further, in the first period to the fourth period, during the transition from one period to another period, the bias voltage may continuously change from the voltage in one period to the voltage in another period. That is, the bias voltage may be immediately changed at t0, t1, t2, t3, and/or t4 or may be gradually changed stepwise or continuously.

Figure 8:
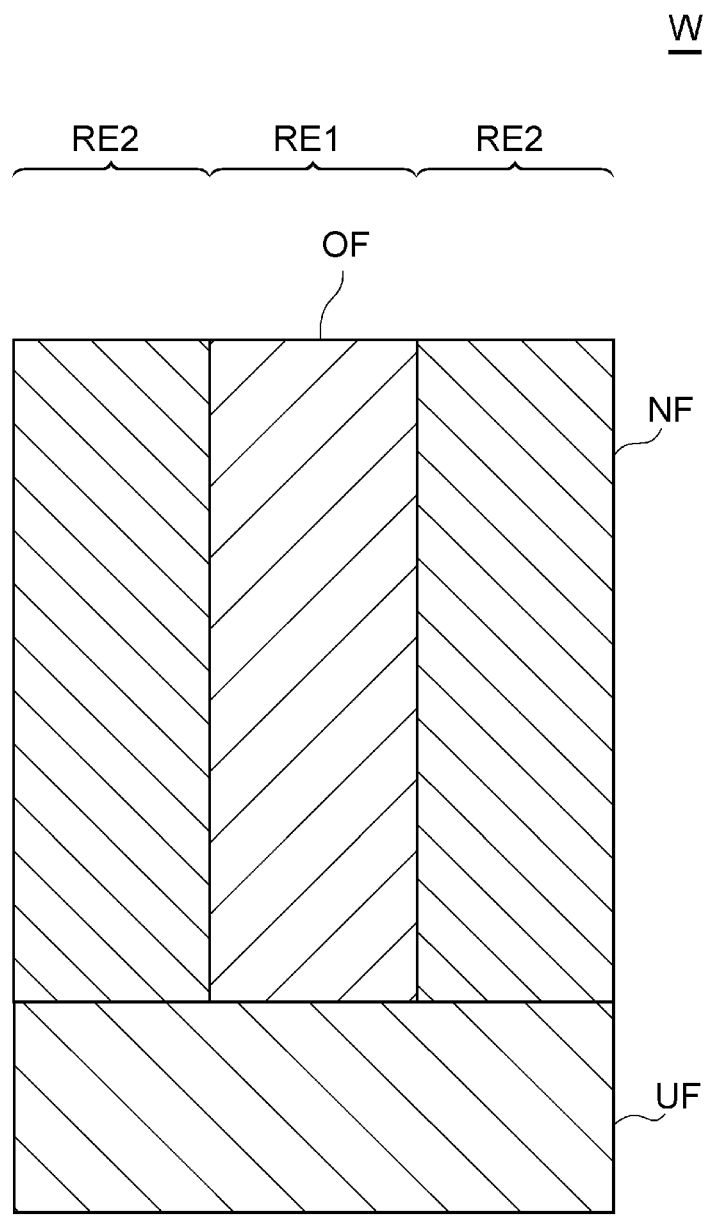
FIG. 8 is a view schematically illustrating an example of a cross-sectional structure of the substrate W according to another example of the present processing method.

FIG. 8 is a view illustrating an example of a cross-sectional structure of a substrate W according to another example of the present processing method. In the substrate W of the present example, a silicon nitride film NF and a silicon oxide film OF are provided on an underlying film UF to be adjacent to each other in an etching direction (that is, a lateral direction in FIG. 8) of the silicon oxide film OF. The silicon nitride film NF is an example of a mask film. Further, the silicon oxide film OF is an example of an etching film. Also in the present example, as in the examples described in FIGS. 3 to 7, the silicon oxide film OF can be etched while the protective film PF is formed on the silicon nitride film NF. Thereby, selectivity of the silicon oxide film OF to the silicon nitride film NF can be improved. Further, another mask film may be further formed on the silicon nitride film NF.

A region RE1 in FIG. 8 is an example of a first region. Further, a region RE2 is an example of a second region. The region RE1 is a region where the silicon oxide film OF is provided on the underlying film UF in a plan view of the substrate W. Further, a region RE2 is a region where the silicon nitride film NF is provided on the underlying film UF in a plan view of the substrate W.

According to the present processing method, a position and a shape of necking of a mask film MF and the protective film PF may be controlled. In this way, while suppressing the necking, etching selectivity between the mask film MF, the protective film PF, and the etching film EF can be improved. For example, in the present processing method, a position of a top portion of the necking is shifted during etching, and a position, in which ions that are obliquely incident on the opening OP collide with a sidewall of the recessed portion RC, is dispersed. In this way, bowing of the recessed portion RC formed in the etching film EF can be suppressed. Further, as the necking shifts downward, etching of the etching film EF may be advanced more. As the necking shifts downward, obstruction of the opening OP is to be resolved, and ions in plasma are easily incident thereon, and thus, an etching rate of the etching film EF may increase.

Further, in the present processing method, selectivity to the etching film EF may be improved. The selectivity is a ratio of an etching rate of the etching film EF to an etching rate of the mask film MF. Particularly, the deeper the recessed portion RC, the higher the selectivity may be. Further, verticality of the recessed portion RC may increase.

According to one exemplary embodiment of the present disclosure, a technique for suppressing necking in etching can be provided.

The above embodiments are described for the purpose of illustration, and various modifications may be made without departing from the scope and idea of the present disclosure. For example, the present processing method may be executed by using a plasma processing apparatus with any plasma source, such as inductively-coupled plasma or microwave plasma, in addition to the capacitively-coupled plasma processing apparatus 1.

The invention claimed is:

1. A plasma processing method executed by a plasma processing apparatus with a chamber, the plasma processing method comprising:
 (a) providing in the chamber a substrate that includes an etching film and a mask film, the substrate including a first region where the etching film is exposed and a second region where the mask film is exposed;
 (b) supplying into the chamber a processing gas including a carbon-containing gas to generate plasma from the processing gas to etch the etching film and to form a protective film on the mask film; and
 (c) supplying the processing gas into the chamber to generate plasma from the processing gas to further etch the etching film and to remove at least part of the protective film,
wherein (b) includes a first period and a second period, and a flow rate of the carbon-containing gas in the first period is greater than a flow rate of the carbon-containing gas in the second period, and
 (c) includes a third period and a fourth period, and a flow rate of the carbon-containing gas in the third period is less than the flow rate of the carbon-containing gas in the second period and a flow rate of the carbon-containing gas in the fourth period.

2. The plasma processing method according to claim 1, wherein
 the mask film is disposed on the etching film,
 the mask film has an upper surface and a side surface, the upper surface covering the etching film in the second region, and the side surface defining an opening through which the etching film is exposed in the first region,
 (b) includes etching the etching film to form a recessed portion in the etching film in the first region, and forming the protective film on at least the upper surface of the mask film, and
 (c) includes removing at least part of the protective film.

3. The plasma processing method according to claim 2, wherein the flow rate of the carbon-containing gas in the fourth period is less than the flow rate of the carbon-containing gas in the second period.

4. The plasma processing method according to claim 1, wherein, during a transition from one period to another period among the first period to the fourth period, the flow rate of the carbon-containing gas changes continuously or stepwise.

5. The plasma processing method according to claim 1, wherein the plasma processing apparatus further includes a substrate support in the chamber,
 (a) includes providing the substrate onto the substrate support, and
 (b) and (c) include supplying a bias signal to the substrate support.

6. The plasma processing method according to claim 5, wherein, in (b), an effective value of power of the bias signal in the first period is greater than an effective value of power of the bias signal in the second period.

7. The plasma processing method according to claim 5, wherein, in (c), an effective value of power of the bias signal in the third period is less than an effective value of power of the bias signal in the fourth period.

8. The plasma processing method according to claim 6, wherein, during the transition from the first period to the second period, the effective value of the power of the bias signal changes continuously or stepwise.

9. The plasma processing method according to claim 1, wherein (b) includes supplying a source RF signal to the chamber to generate the plasma, and an effective value of power of the source RF signal in the first period is less than an effective value of power of the source RF signal in the second period.

10. The plasma processing method according to claim 9, wherein (c) includes supplying a source RF signal to the chamber to generate the plasma, and an effective value of power of the source RF signal in the third period is greater than an effective value of power of the source RF signal in the fourth period.

11. The plasma processing method according to claim 1, wherein the processing gas includes an oxygen-containing gas, and in (b), a flow rate of the oxygen-containing gas in the first period is greater than a flow rate of the oxygen-containing gas in the second period.

12. The plasma processing method according to claim 1, wherein the processing gas includes an oxygen-containing gas, and in (c), a flow rate of the oxygen-containing gas in the third period is less than a flow rate of the oxygen-containing gas in the fourth period.

13. The plasma processing method according to claim 1, wherein
 the substrate further includes an underlying film,
 the etching film is disposed at least in the first region, and
 the mask film is disposed to be adjacent to the etching film at least in the second region in a direction perpendicular to a direction in which the etching film is etched.

14. The plasma processing method according to claim 1, wherein the etching film is a silicon oxide film or a silicon nitride film.

15. The plasma processing method according to claim 1, wherein the mask film includes at least one of a boron-containing silicon film, a carbon-containing film, a nitrogen-containing film, and a tungsten silicon film.

16. The plasma processing method according to claim 1, wherein the carbon-containing gas is $C_aF_b$ (a and b are integers of 1 or more) gas or $C_cH_dF_e$ (c, d, and e are integers of 1 or more) gas.

17. The plasma processing method according to claim 1, wherein (b) and (c) are repeated a plurality of times.

18. The plasma processing method according to claim 2, wherein, in at least part of the first period to the fourth period, a peak portion of the protective film formed on the side surface of the mask film shifts in a direction in which the etching film is etched.

19. A plasma processing method executed by a plasma processing apparatus with a chamber, the plasma processing method comprising:
 (a) providing in the chamber a substrate, which includes a first region having a portion where an etching film is exposed and a second region where a mask film is exposed;
 (b) supplying a processing gas including a carbon-containing gas at a first flow rate into the chamber to generate plasma to etch the etching film and to form a protective film on the mask film;
 (c) supplying a processing gas including a carbon-containing gas at a second flow rate less than the first flow rate into the chamber to generate plasma to further etch the etching film and to form the protective film on the mask film;
 (d) supplying a processing gas including a carbon-containing gas at a third flow rate into the chamber to generate plasma to further etch the etching film and to remove a part of the protective film on the mask film; and
 (e) supplying a carbon-containing gas at a fourth flow rate that is less than the second flow rate and greater than the third flow rate into the chamber to generate plasma to further etch the etching film and to further remove the protective film on the mask film.

* * * * *